United States Patent [19]

Scholl

[11] Patent Number: 4,544,938
[45] Date of Patent: Oct. 1, 1985

[54] WAVELENGTH-SELECTIVE PHOTODETECTOR

[75] Inventor: Frederick Scholl, Bronx, N.Y.

[73] Assignee: Codenoll Technology Corporation, Yonkers, N.Y.

[21] Appl. No.: 442,677

[22] Filed: Nov. 18, 1982

[51] Int. Cl.[4] .................. H01L 27/14; H01L 29/161
[52] U.S. Cl. ......................................... 357/30; 357/16
[58] Field of Search ................................... 357/16, 30

[56] References Cited

U.S. PATENT DOCUMENTS

| | | | |
|---|---|---|---|
| 3,727,115 | 4/1973 | Shang | 357/17 |
| 3,812,516 | 5/1974 | Hayashi | 357/16 |
| 4,122,476 | 10/1978 | Hovel et al. | 357/16 |
| 4,207,122 | 6/1980 | Goodman | 357/16 |
| 4,328,508 | 5/1982 | Kressel et al. | 357/16 |
| 4,427,841 | 1/1984 | Rahilly | 357/30 |

OTHER PUBLICATIONS

Hovel, *IBM Technical Disclosure Bulletin*, vol. 5, No. 12, May 1973, p. 3741 and vol. 15, No. 11, Apr. 1973, p. 3443.

*Primary Examiner*—Martin H. Edlow
*Assistant Examiner*—Terri M. Henn
*Attorney, Agent, or Firm*—Pennie & Edmonds

[57] ABSTRACT

A heterojunction photodiode with improved wavelength-selectivity and risetime. The problem of short-wavelength diffusion-tail response is avoided by interposing between the window and active layers a barrier layer of higher bandgap than that of the window layer, which prevents high-energy photocarriers generated in the window layer from diffusing to the PN junction. In one embodiment, n-type substrate, active, barrier, and window layers are initially grown, and the window layer is coated with an opaque oxide. A window is opened in the oxide layer, and a p-type dopant is diffused heavily through the opening, through the window layer, and partly into the barrier layer. A PN junction is thus formed in the barrier layer, its depletion region extending through the remaining n-type region of the barrier layer and into the active layer, where photocarriers are generated by photons passing through the window-opening.

18 Claims, 2 Drawing Figures

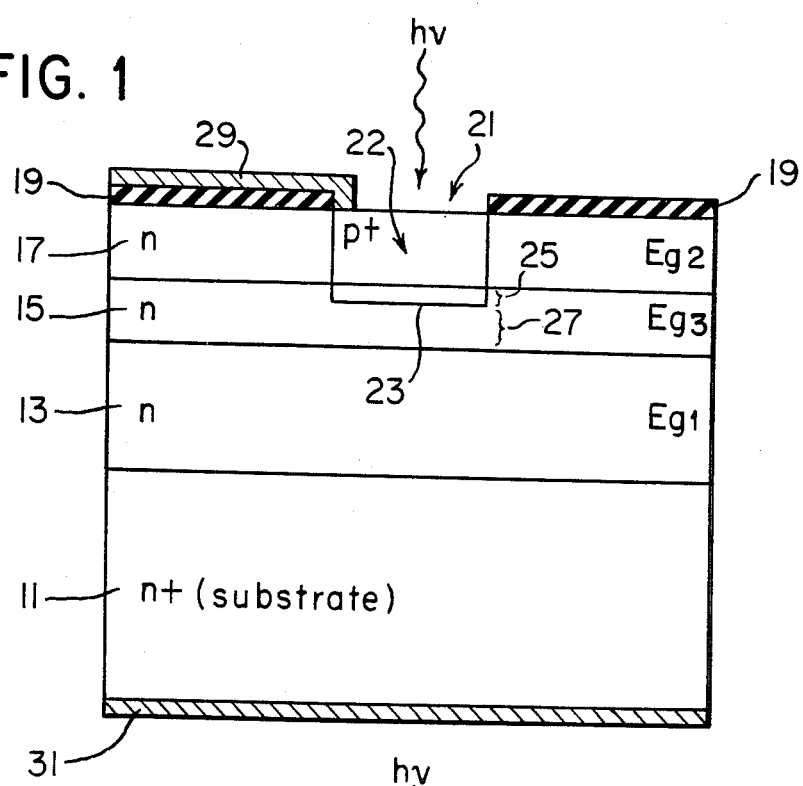
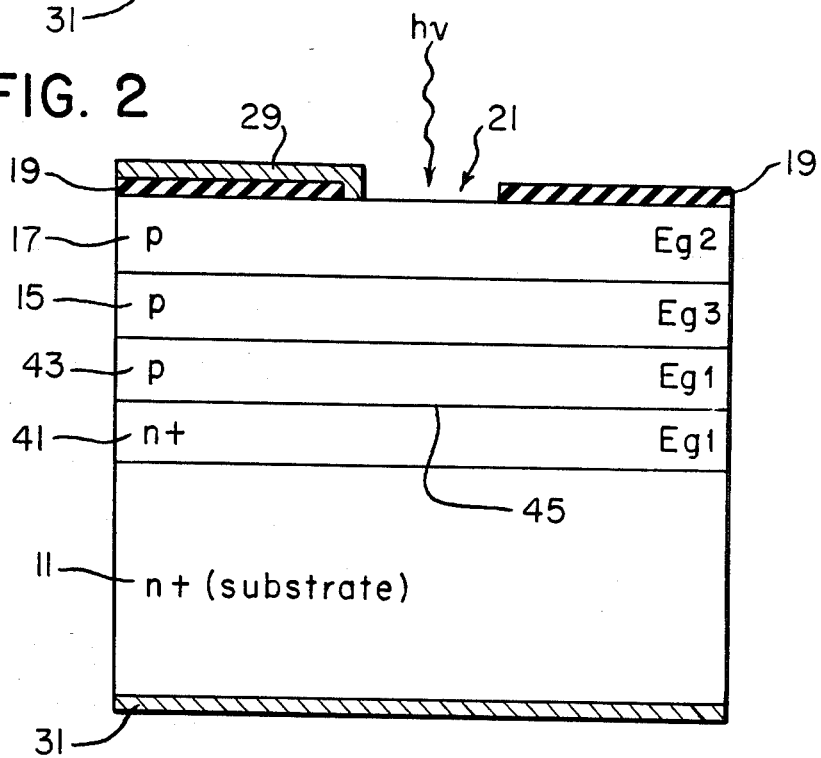

4,544,938

WAVELENGTH-SELECTIVE PHOTODETECTOR

BACKGROUND OF THE INVENTION

This invention relates to semiconductor photodetectors, and more particularly to a heterojunction photodiode device of improved wavelength-selectivity.

To fully utilize the bandwidth capacity of optical fibers, wavelength multiplexing may be used, in which multiple carrier wavelengths are generated by LED or laser sources and the optical energy of all the sources is coupled to a single fiber trunk for transmission.

At the receiver, several carrier wavelengths can be separated by a variety of techniques. One such technique makes use of broadband optical detectors coupled with wavelength-selective components such as lenses, prisms, gratings, and interference filters. Such a technique has the disadvantage of requiring precise tuning and orientation of its multiple components.

It would be highly desirable if the detection and demultiplexing of multiple-wavelength optical signals could be performed by a semiconductor photodetector, which would be simpler in design than the prior art devices, and whose wavelength response would be inherent in its component materials and thus not depend on delicate mechanical adjustments or manufacturing steps.

Such a detector should have high selectivity, thus maximizing the number of channels that a single optical fiber can accommodate without objectionable crosstalk. It should operate in the near-infrared region (about 0.8 to 1.6 $\mu$m) most important in optical-fiber communications, and have high response speed to further improve signal bandwidth. The device further should have high sensitivity, low noise, and low biasing voltage or current requirements, and be both compact and reliable. These characteristics, and particularly selectivity and response speed, are directly related to optimizing the information-carrying capacity of a given optical fiber.

It has been attempted to achieve such results with a heterojunction photodiode, in which a window layer of one conductivity type having a wide bandgap (say $Eg_2$) forms a PN junction with an active layer of the opposite conductivity type having a narrow bandgap (say $Eg_1$).

Photons whose energy exceeds $Eg_2$ are absorbed as they enter the window layer. Photons with energy less than $Eg_2$ but greater than $Eg_1$ pass through the window layer and are absorbed in the vicinity of the junction, and preferably in the depletion region thereof, as they enter the active layer, generating carriers which constitute the desired photocurrent. No photoresponse occurs to photons whose energy is less than $Eg_1$, these passing entirely through the detector.

The photodiode thus responds primarily to photons whose energy E is in the range $Eg_2 > E > Eg_1$. In terms of wavelength, response is limited to $\lambda_1 > \lambda > \lambda_2$ where $\lambda_1$ and $\lambda_2$ correspond to $Eg_1$ and $Eg_2$, respectively.

As photon energy exceeds the $Eg_1$ level, photoresponse increases rapidly due to the exponential absorption edge characteristic of direct gap semiconductors. Photoresponse can approach unity quantum efficiency (electron-hole pairs generated per photon) until the energy reaches $Eg_2$.

Quantum efficiency does not decrease rapidly to zero as E exceeds $Eg_2$ in such a device, however, because high-energy carriers generated in the window layer diffuse to the junction and contribute a substantial short-wavelength diffusion tail to measured photoresponse. This lack of a sharp high-energy (short-wavelength) cutoff has an obvious deleterious effect on selectivity. Moreover, the substantial phase difference between the current due to diffused carriers and that due to those that cross the junction by drift has a deleterious effect on response time, and therefore places an upper limit on the range of usable signal frequencies.

OBJECTS AND SUMMARY OF THE INVENTION

Accordingly, a general object of the invention is to avoid the disadvantages of the prior art by providing an improved semiconductor photodetector.

Two specific objects are to achieve improved selectivity (narrower optical bandwidth) and response time in a heterojunction photodiode.

In accordance with illustrative embodiments of the invention a wavelength-selective photodetector is provided by epitaxially growing a bottom semiconductor layer of a first conductivity type on a substrate of the same type. On the bottom layer are epitaxially grown an intermediate semiconductor layer and a top semiconductor layer, the top layer being of the opposite conductivity type and the intermediate layer including a barrier region of that opposite conductivity type adjacent to the top layer. The bottom and top layers and the barrier region in the intermediate layer that is adjacent to the top layer have unequal bandgaps, the bandgap of such adjacent barrier region being greater than that of the top layer, and the bandgap of the top layer being greater than that of the bottom layer. A carrier depletion region for collection of carriers generated at least in the bottom layer encompasses at least the junction of the intermediate and bottom layers. Electrode means connected to the substrate and the top layer are provided for coupling sources of electrical potential to the carrier depletion region.

A feature of the invention is that photons that enter the detector through the top layer and have an energy greater than the bandgap of the top layer are absorbed therein. Any charge carriers generated in this layer are electrically isolated at least by the adjacent barrier region of higher bandgap in the intermediate layer, and are thus prevented from diffusing through the intermediate layer to the carrier depletion region.

Minority carriers from the top layer therefore do not contribute to the output current of the detector, thus accomplishing the objects stated previously.

The invention, as well as further objects and advantages thereof, will be understood more clearly and fully from the following description of certain preferred embodiments, when read with reference to the accompanying drawings, in which like reference numerals denote like elements.

BRIEF DESCRIPTION OF THE DRAWINGS

FIG. 1 is a simplified cross-sectional view of a wavelength-selective photodetector in accordance with one embodiment of the invention; and FIG. 2 is a simplified cross-sectional view of a wavelength-selective photodetector in accordance with a second embodiment of the invention.

DETAILED DESCRIPTION

Referring to FIG. 1, there is seen an example of a wavelength-selective heterojunction photodiode including a heavily doped n-type substrate 11, and lightly doped n-type bottom, intermediate, and top layers 13, 15, and 17, respectively, epitaxially grown one on another. Other semiconductor fabrication techniques may also be used. Layers 13, 15, and 17 will also be referred to as the active, barrier, and window layers, respectively, and their corresponding bandgaps will be referred to as $Eg_1$, $Eg_3$, and $Eg_2$.

For photodetection of wavelengths approximating 0.85 μm, the substrate 11 may advantageously be composed of GaAs and the layers 13, 15, and 17 of alloys whose compositions are of the form $Ga_{1-x}Al_xAs$. The compositions of the bottom and top layers 13 and 17 are selected to have bandgaps respectively corresponding to the minimum and maximum photon energies (longest and shortest wavelengths) desired to be detected. The composition of intermediate layer 15 is preferably selected such that its bandgap exceeds that of top layer 17 under normal operating conditions by at least 5kT, where k is Boltzmann's constant and T is the temperature in degrees Kelvin.

Over the upper surface of the top layer 17 is applied a conventional oxide film 19. A central window 21 is opened in the film 19 and a p-type dopant, for example Zn, is diffused heavily through the window 21 to form a diffused region 22 in the top layer 17 and in a portion of the intermediate layer 15. Thus a PN junction 23 is formed within the intermediate layer by a heavily doped p-type first region 25 adjacent to the top layer and an n-type second region 27 between the first region and the bottom layer. The PN junction of the detector is coupled to external circuitry by metal contacts 29 and 31, which are respectively connected to diffused region 22 and substrate 11. The functions of the substrate 11 in this embodiment are only to mechanically support the other layers and to provide an electrical connection between the bottom layer 13 and the contact 31.

The short-wavelength diffusion tail discussed previously is eliminated by the interposition of wide-bandgap layer 15 between window layer 17 and active layer 13. The PN junction 23 formed by the diffusion front can be located substantially anywhere within the layer 15, without affecting device performance, as long as the barrier layer is not excessively thick.

The diffusion front should not penetrate the active layer 13, however, as in that situation carriers would be transported across the junction by diffusion, rather than drift, increasing device risetime. Under conventional biasing conditions, the depletion region in the device extends from a relatively small distance above the PN junction in the heavily doped region 25, and through the more lightly doped region 27 and some distance into the lightly doped active layer 13. In response to photons entering the device through window 21, charge carriers which contribute to the output current of the device are generated only in the active layer near its interface with the barrier layer. Minority carriers are accordingly generated in or near the depletion region, i.e., near enough to the PN junction to be swept across the junction by drift.

If the highly doped p-type region were to be extended into the active layer, however, substantial numbers of photocarriers would be generated in that region above the relatively narrow depletion region, as well as in the active layer. In such a situation, some photoelectrons would travel downward to the junction by diffusion, a slower transport mechanism, superimposing a slow diffusion tail on an otherwise faster response characteristic.

A second embodiment of the invention is shown in FIG. 2. Elements of the second embodiment that are analogous to those of the first will not be further discussed.

Rather than a single active layer as in the device of FIG. 1, the second embodiment has first and second active layers 41 and 43, respectively, both having bandgap $Eg_1$, the first a heavily doped n-type layer grown on the substrate, and the second a lightly doped p-type layer grown on the first. A PN junction 45 is formed by layers 41 and 43, its depletion region encompassing substantially all of the second layer 43, in which substantially all of the photocarriers generated by photons passing through window 21 are generated. As in the first embodiment, such carriers are also swept across the junction by drift rather than diffusion, as long as active layer 43 is sufficiently thin and the bias voltage sufficiently high that the electric field of the junction extends substantially fully through the layer 43.

The embodiments detailed above are capable of detecting optical energy of a given wavelength with high selectivity and fast risetime. In each, the barrier layer prevents photoelectrons generated in the window layer from migrating by diffusion to the junction, eliminating the short wavelength diffusion tail which is characteristic of prior art devices. Wavelength selectivity for both long and short wavelengths is determined solely by the sharpness of the alloy absorption edges.

A variety of known combinations of alloys and other materials are usable in the disclosed embodiments. The manner in which the bandgaps of the respective layers are selected and relate to one another has been set forth previously. Such a device may incorporate alloys of the form $Ga_{1-x}Al_xAs$, for example, whose bandgaps range from 1.4 ev to 2.0 ev. Assuming layer and depletion region thicknesses of the order of 5 μm, a range of wavelengths from 0.6 to 0.9 μm can be divided into approximately thirteen channels, each which can be detected by a corresponding detector with crosstalk of the order of −20 db and quantum efficiency approaching unity.

The terms and expressions that have been employed herein are used as terms of description and not of limitation, and there is no intention in the use of such terms and expressions of excluding any equivalents of the features shown or described or portions thereof, but rather it is recognized that various modifications are possible within the scope of the invention as defined in the claims.

What is claimed is:
1. A semiconductor device comprising:
   a first semiconductor layer of a first conductivity type;
   a second semiconductor layer formed on said first layer; and
   a third semiconductor layer of an opposite conductivity type to said first type formed on said second semiconductor layer;
   said second semiconductor layer including a first region of said opposite conductivity type adjacent to said third semiconductor layer, and a second region of said first conductivity type adjacent to said first semiconductor layer;
   said two regions of said second semiconductor layer forming therebetween a PN junction and a carrier depletion region for collection of carriers generated at least in said first semiconductor layer, said depletion region encompassing at least the junction between said first and second semiconductor layers; and said first semiconductor layer, said third semiconductor layer, and said first region having unequal bandgaps, the bandgap of said first region being greater than that of said third semiconductor layer, and the bandgap of said third semiconductor layer being greater than that of said first semiconductor layer; and further comprising electrode means connected to said first semiconductor layer and said third semiconductor layer for coupling sources of electrical potential to said PN junction and said carrier depletion region.

2. A semiconductor device comprising:

a first semiconductor layer of a first conductivity type;

a second semiconductor layer formed on said first semiconductor layer; and a third semiconductor layer of an opposite conductivity type formed on said second semiconductor layer;

said second semiconductor layer including a first region of said opposite conductivity type adjacent to said third semiconductor layer and a second region of said first conductivity type between said first region and said first semiconductor layer, said first and second regions forming a PN junction; and said first, second, and third semiconductor layers having unequal bandgaps, the bandgap of said second semiconductor layer being greater than that of said third semiconductor layer, and the bandgap of said third semiconductor layer being greater than that of said first semiconductor layer; and further comprising electrode means connected to said first semiconductor layer and to said third semiconductor layer for coupling sources of electrical potential to said PN junction.

3. A semiconductor device as defined in claim 2, wherein said first and second regions of said second semiconductor layer are both lightly doped with a dopant of said first conductivity type, and said first region of said second semiconductor layer is heavily doped with a dopant of said opposite conductivity type.

4. A semiconductor device as defined in claim 3, wherein said third semiconductor layer is lightly doped with a dopant of said first conductivity type and heavily doped with the same dopant of said opposite conductivity type as in said first region of said second semiconductor layer.

5. A semiconductor device as defined in claim 4, wherein said dopant of said opposite conductivity type in said second and third semiconductor layers forms a diffused region extending from at least part of an upper surface of said third semiconductor layer throough said third semiconductor layer and into at least part of an upper surface of said second semiconductor layer.

6. A semiconductor device as defined in claim 5, wherein a part of said upper surface of said third semiconductor layer not containing said dopant of said opposite conductivity type has a substantially opaque coating.

7. A semiconductor device as defined in claim 2, wherein the respective bandgaps of said second and third semiconductor layers are selected such that the bandgap of said second semiconductor layer exceeds that of said third semiconductor layer under normal operating conditions by at least 5kT, where k is Boltzmann's constant and T is the temperature in degrees Kelvin.

8. A semiconductor device as defined in claim 2, wherein said first, second and third semiconductor layers are alloys of gallium, aluminum, and arsenic having compositions of the form $Ga_{1-x}Al_xAs$, respective values of x being selected such that the bandgap of said second semiconductor layer exceeds that of said third semiconductor layer under normal operating conditions by at least 5kT, where k is Boltzmann's constant and T is the temperature in degrees Kelvin.

9. A semiconductor device as defined in claim 2, wherein said formation of said semiconductor layers one on another includes an epitaxial growth process.

10. A semiconductor device comprising:

a first semiconductor layer of a first conductivity type;

a second semiconductor layer of an opposite conductivity type formed on said first semiconductor layer;

a third semiconductor layer of said opposite conductivity type formed on said second semiconductor layer;

a fourth semiconductor layer of said opposite conductivity type formed on said third semiconductor layer;

said first and second semiconductor layers having substantially equal bandgaps, said two semiconductor layers forming a PN junction; and said first, third, and fourth semiconductor layers having unequal bandgaps, the bandgap of said third semiconductor layer being greater than that of said fourth semiconductor layer, and the bandgap of said fourth semiconductor layer being greater than that of said first semiconductor layer; and further comprising electrode means connected to said first semiconductor layer and to said fourth semiconductor layer for coupling sources of electrical potential to said PN junction.

11. A semiconductor device as defined in claim 10, wherein said formation of said semiconductor layers one on another includes an epitaxial growth process.

12. A semiconductor device as defined in claim 2, including a carrier depletion region encompassing said PN junction for the collection of carriers generated at least in said first semiconductor layer, said depletion region also substantially encompassing the junction between said first and second semiconductor layers.

13. A semiconductor device as defined in claim 12, wherein said first and second regions of said second semiconductor layer are, respectively, heavily and lightly doped, so that said depletion region extends relatively farther from said PN junction in the direction of said first semiconductor layer, than it extends in the direction of said third semiconductor layer.

14. A wavelength-selective semiconductor photodetector comprising:

an active layer of a first conductivity type, a barrier layer formed on said active layer; and a window layer of a conductivity type opposite to said first type formed on said barrier layer;

said barrier layer including an upper region of said opposite conductivity type adjacent to said window layer and a lower region of said first conductivity type adjacent to said active layer;

said two regions of said barrier layer forming therebetween a PN junction and a carrier depletion region for collection of charge carriers generated by absorption in the active layer of photons which enter the photodetector through the window layer, said depletion region encompassing at least the junction between said active and barrier layers; and said active, barrier, and window layers having unequal bandgaps, the bandgaps of the barrier layer and active layer being greatest and least, respectively, so that charge carriers generated by photon absorption in said window layer are substantially isolated by said barrier layer from said PN junction; and further comprising electrode means connected to said active and window layers for coupling sources of electrical potential to said PN junction.

15. A semiconductor device as defined in claim 10, wherein the respective bandgaps of said third and fourth semiconductor layers are selected such that the bandgap of said third semiconductor layer exceeds that of said fourth semiconductor layer under normal operating conditions by at least 5kT, where k is Boltzmann's constant and T is the temperature in degrees Kelvin.

16. A semiconductor device as defined in claim 10, wherein said first, second, third, and fourth semiconductor layers are alloys of gallium, aluminum, and arsenic having compositions of the form $Ga_{1-x}Al_xAs$ respective values of x being selected such that the bandgap of said third semiconductor layer exceeds that of said fourth semiconductor layer under normal operating conditions by at least 5kT, where k is Boltzmann's constant and T is the temperature in degrees Kelvin.

17. A semiconductor device as defined in claim 10, including a carrier depletion region, encompassing said PN junction and substantially all of said second semiconductor layer, for the collection of carriers generated at least in said second semiconductor layer.

18. A semiconductor device as defined in claim 17, wherein said first and second semiconductor layers are, respectively, heavily and lightly doped, so that said depletion region extends relatively farther from said PN junction into said second semiconductor layer, than it extends into said first semiconductor layer.

* * * * *